US009355972B2

(12) United States Patent
Dunn et al.

(10) Patent No.: US 9,355,972 B2
(45) Date of Patent: May 31, 2016

(54) METHOD FOR MAKING A DIELECTRIC REGION IN A BULK SILICON SUBSTRATE PROVIDING A HIGH-Q PASSIVE RESONATOR

(71) Applicant: International Business Machines Corporation, Armonk, NY (US)

(72) Inventors: James S. Dunn, Jericho, VT (US); Zhong-Xiang He, Essex Junction, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/196,137

(22) Filed: Mar. 4, 2014

(65) Prior Publication Data
US 2015/0255528 A1 Sep. 10, 2015

(51) Int. Cl.
*H01L 23/66* (2006.01)
*H01L 49/02* (2006.01)
*H01L 29/06* (2006.01)
*H01L 23/522* (2006.01)
*H01L 21/762* (2006.01)

(52) U.S. Cl.
CPC ............ *H01L 23/66* (2013.01); *H01L 21/762* (2013.01); *H01L 23/5227* (2013.01); *H01L 28/40* (2013.01); *H01L 29/0649* (2013.01); *H01L 23/5223* (2013.01); *H01L 28/10* (2013.01); *H01L 2223/6672* (2013.01)

(58) Field of Classification Search
None
See application file for complete search history.

(56) References Cited

U.S. PATENT DOCUMENTS

| | | | |
|---|---|---|---|
| 5,315,151 A * | 5/1994 | Hsieh et al. | 257/592 |
| 6,140,674 A * | 10/2000 | Hause et al. | 257/301 |
| 6,349,454 B1 * | 2/2002 | Manfra et al. | 29/25.35 |
| 6,452,249 B1 | 9/2002 | Maeda et al. | |
| 6,492,708 B2 | 12/2002 | Acosta et al. | |
| 6,693,039 B2 | 2/2004 | Erratico et al. | |
| 6,720,229 B2 | 4/2004 | Norstrom et al. | |
| 6,720,230 B2 | 4/2004 | Acosta et al. | |
| 6,762,088 B2 | 7/2004 | Acosta et al. | |
| 7,612,428 B2 | 11/2009 | Park et al. | |
| 8,048,760 B2 | 11/2011 | Gogoi et al. | |
| 8,063,467 B2 | 11/2011 | Tischler | |
| 8,310,053 B2 | 11/2012 | Verheijden et al. | |
| 8,395,233 B2 | 3/2013 | Smith et al. | |
| 2002/0017698 A1 * | 2/2002 | Davies | 257/522 |
| 2005/0215007 A1 * | 9/2005 | Cheng et al. | 438/244 |
| 2008/0020488 A1 * | 1/2008 | Clevenger et al. | 438/3 |
| 2009/0101957 A1 * | 4/2009 | Cheng | H01L 21/30608 257/301 |

(Continued)

OTHER PUBLICATIONS

U.S. Appl. No. 14/830,816, Office Action Communication, Feb. 25, 2016. pp. 1-6.

(Continued)

*Primary Examiner* — Mohammad Islam
*Assistant Examiner* — Mikka Liu
(74) *Attorney, Agent, or Firm* — Gibb & Riley, LLC; Steven J. Meyers, Esq.

(57) ABSTRACT

Structures and methods of making a dielectric region in a bulk silicon (Si) substrate of a mixed-signal integrated circuit (IC) provide a high-Q passive resonator. Deep trenches within the bulk Si substrate in <100> directions are expanded by wet etching to form contiguous cavities, which are filled by Si oxide to form a dielectric region. The dielectric region enhances the quality (Q) of an overlying passive resonator, formed in metallization layers of the mixed-signal IC.

20 Claims, 9 Drawing Sheets

(56) References Cited

U.S. PATENT DOCUMENTS

2009/0146249 A1 6/2009 Gogoi et al.
2010/0032750 A1 2/2010 Davies

OTHER PUBLICATIONS

U.S. Appl. No. 14/830,816, Office Action Communication, Sep. 18, 2015, pp. 1-20.

Overlie. (n.d.) American Heritage® Dictionary of the English Language, Fifth Edition. (2011). Retrieved Sep. 8, 2015 from http://www.thefreedictionary.com/overlie.

Lie. (n.d.) American Heritage® Dictionary of the English Language, Fifth Edition. (2011). Retrieved Sep. 8, 2015 from http://www.thefreedictionary.com/lie.

Orient. (n.d.) American Heritage® Dictionary of the English Language, Fifth Edition. (2011). Retrieved Sep. 9, 2015 from http://www.thefreedictionary.com/orient.

\* cited by examiner

250 trenches along <110> directions

(100) surface plane

{111} etch stop planes cavity along [110] direction

350 trenches along <100> directions

(100) surface plane cavity along [100] direction

370

{110} non-etch stop planes

METHOD FOR MAKING A DIELECTRIC REGION IN A BULK SILICON SUBSTRATE PROVIDING A HIGH-Q PASSIVE RESONATOR

BACKGROUND

1. Field of the Invention

The present disclosure relates to structures and methods of making a dielectric region in a bulk silicon (Si) substrate of a mixed-signal integrated circuit (IC) to provide a high-Q passive resonator.

2. Description of Related Art

Typically, passive resonators, e.g., inductors and capacitors, are formed in metallization layers, associated with back-end-of-line (BEOL) processes in the making of mixed-signal integrated circuits (ICs), that overlie the bulk silicon (Si) substrates of a Si wafer. After the last front-end-of-line FEOL process, associated with the making of active devices on the bulk Si substrates of the mixed-signal ICs of the Si wafer, there exist isolated active devices such as, transistors, which are not electrically interconnected to form electrical circuits. In the BEOL processes, electrical contacts, wire interconnects, vias and dielectric structures are formed to interconnect the isolated active devices, forming the desired electrical circuits. A passive resonator may also be formed during the BEOL processes above the bulk Si substrate.

Typically, the active devices formed within the FEOL layers are not disposed beneath a passive resonator, because the electric fields generated by the passive resonator adversely affect operation of the active devices. The distance between the passive resonator, formed on top of the BEOL metallization layers to the underlying bulk Si substrate of the mixed-signal IC can range to about 10 μm.

For a passive resonator, the quality factor, Q, is defined in terms of the ratio of the energy stored in the passive resonator to the energy supplied by the generator to keep the signal amplitude constant at the resonant frequency, $f_r$. Typically, an inductor formed on an IC experiences high losses at radio frequencies (RF) and consequently has a low Q value.

One approach to improving Q of a passive resonator formed above a bulk Si substrate of a mixed-signal IC at RF frequencies is to increase the effective "distance" to the underlying bulk Si substrate by increasing the electrical resistance between the passive resonator and the bulk Si substrate. For example, a thick oxide layer of several micrometers thickness when disposed between the passive resonator and the bulk Si substrate improves the Q factor of the passive resonator.

Figure 1A:
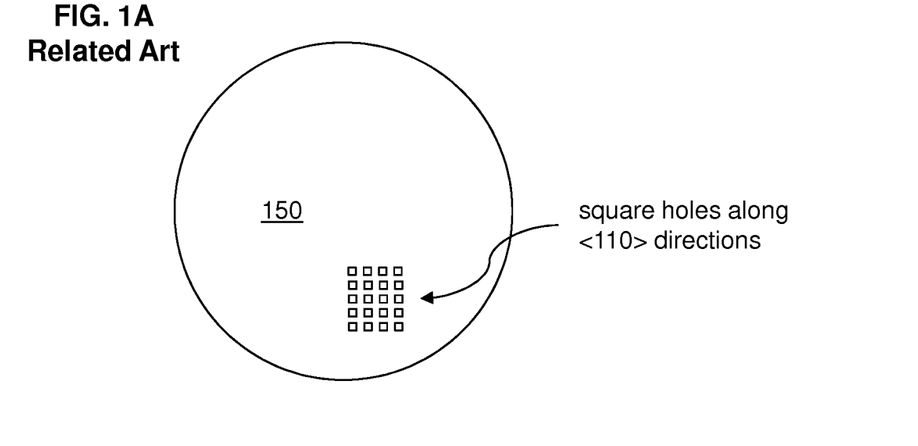
FIG. 1A is a schematic diagram illustrating square holes oriented along <110> directions of a hard mask overlying a (100) silicon (Si) wafer in the prior art.
Figure 1B:
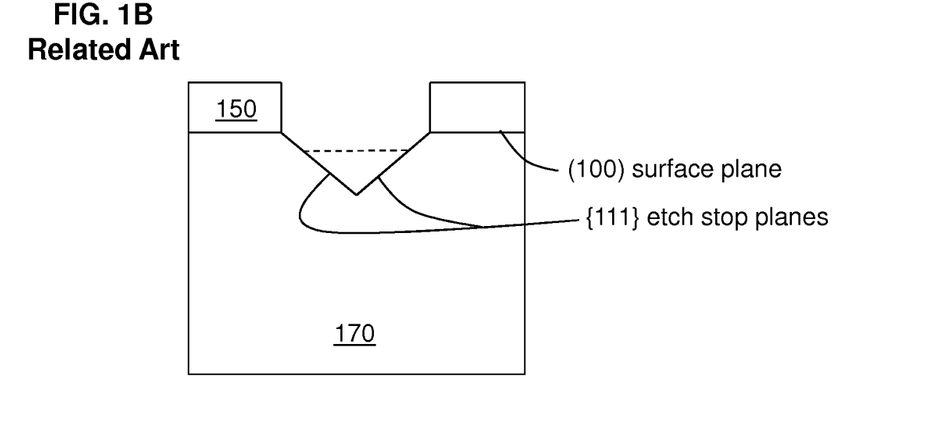
FIG. 1B is a schematic diagram illustrating anisotropic etching through the square holes oriented along <110> directions of a hard mask overlying a (100) silicon (Si) wafer in the prior art.

Alternatively, etching the bulk Si substrate underlying an area upon which a passive resonator is to be formed can provide a cavity or air gap of relatively high electrical resistance between the passive resonator and the bulk Si substrate. Anisotropic etchants etch crystalline materials, such as crystalline Si, at very different rates depending on which crystal face or plane is exposed. Referring to FIGS. 1A and 1B, square holes or rectangular holes (not shown), oriented along <110> directions of a (100) crystalline Si wafer (170), are formed in a patterned hard mask 150 on a (100) surface plane of the crystalline Si wafer (170). Anisotropic etching through the square holes or rectangular holes proceeds into the depth of the crystalline Si wafer (170) and spreads laterally until inhibited by {111} etch stop planes of the crystalline silicon.

Thus, in the case of a square hole, a short duration of anisotropic etching forms a cavity of an inverted four-sided trough with trapezoidal sides corresponding to {111} etch stop planes, a base corresponding to the square hole at the (100) surface plane of the crystalline Si wafer (170), and a square surface (dashed line) as shown in FIG. 1B, which corresponds to an etched (100) plane of the crystalline Si wafer (170). A longer duration of anisotropic wet etching through a square hole forms a cavity of an inverted four-sided pyramid, as also shown in FIG. 1B, with triangular sides corresponding to self-limiting {111} etch stop planes and a base corresponding to the square hole at the (100) surface plane of the crystalline Si wafer (170).

Similarly, a short duration of anisotropic wet etching through a rectangular hole, longitudinally-oriented along a [110] direction of the patterned hard mask 150, will form an inverted four-sided trough, longitudinally-oriented along the [110] direction, with trapezoidal sides and end caps corresponding to {111} etch stop planes, a base at the (100) surface plane of the crystalline Si wafer (170) corresponding to the rectangular hole, and a rectangular surface (dashed line), also longitudinally-oriented along the [110] direction, corresponding to an etched (100) plane within the crystalline Si wafer (170). Likewise, a longer duration of anisotropic etching through the rectangular hole, longitudinally-oriented along a [110] direction of the patterned hard mask 150, will form a V-shaped groove, longitudinally-oriented along the [110] direction, with self-limiting triangular end caps and trapezoidal sides corresponding to {111} etch stop planes, and a base at the (100) surface plane of the Si wafer (170) corresponding to the rectangular hole of the patterned hard-mask 150.

There remains a need to efficiently form, before the onset of back-end-of-line (BEOL) processes, a dielectric region in a bulk silicon (Si) substrate of a mixed-signal IC, to improve the quality factor, Q, of an overlying passive resonator.

SUMMARY

In view of the foregoing, the disclosure may provide a method of making a dielectric region to provide a high-Q passive resonator in a mixed-signal integrated circuit (IC). The method may include patterning and etching a hard mask to form a plurality of holes along <100> directions that overlie a bulk Si substrate of a (100) Si wafer. The method may also include deep trench etching the bulk Si substrate through the plurality of holes, to form a plurality of deep trenches with vertical sidewalls. The method may further include wet etching of the plurality of deep trenches, to provide a plurality of cavities with thin Si sidewalls between adjacent cavities and to remove undercut regions. The method may yet further include oxidizing of sidewalls of the plurality of cavities, including the thin Si sidewalls, to form Si oxide sidewalls. The method may yet further include filling the plurality of cavities with a Si oxide to form the dielectric region including a plurality of Si oxide filled cavities separated by the thin Si oxide sidewalls. The method may yet further include depositing and planarizing a dielectric layer over the hard mask and the dielectric region. Finally, the method may include forming the high-Q passive resonator in metallization layers, associated with back-end-of-line (BEOL) processes in the making of the mixed-signal IC, over the dielectric region.

The disclosure may also provide another method of making a dielectric region to provide a high-Q passive resonator in a mixed-signal integrated circuit (IC). The method may include patterning and etching a hard mask to form a plurality of holes along <100> directions that overlie a bulk Si substrate of a (100) Si wafer. The method may also include deep trench etching the bulk Si substrate through the plurality of holes, to form a plurality of deep trenches. The method may further include wet etching of the plurality of deep trenches, to provide a plurality of cavities. The method may yet further include oxidizing sidewalls of the plurality of cavities to form Si oxide sidewalls. The method may yet further include filling the plurality of cavities with a Si oxide to form the dielectric region. Finally, the method may include forming the high-Q passive resonator in metallization layers, associated with back-end-of-line (BEOL) processes in the making of the mixed-signal IC, over the dielectric region.

The disclosure may further provide a structure of a mixed-signal circuit with a dielectric region to provide a high-Q passive resonator. The mixed-signal integrated circuit (IC) may include: a bulk silicon (Si) substrate of a (100) Si wafer; a dielectric region extending down into the bulk Si substrate, and having sidewalls that are oriented in <100> directions; a hard mask including a plurality of holes oriented in the <100> directions that overlies the dielectric region; a dielectric layer that overlies the hard mask and the dielectric region; and a high-Q passive resonator, formed in metallization layers, associated with back-end-of-line (BEOL) processes, that overlies the dielectric region.

BRIEF DESCRIPTION OF THE DRAWINGS

The methods of the disclosure herein will be better understood from the following detailed description with reference to the drawings, which are not necessarily drawn to scale and in which.

DETAILED DESCRIPTION

The exemplary methods of the disclosure and their various features and advantageous details are explained more fully with reference to the non-limiting exemplary methods that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary methods, systems and products of the disclosure. The examples used herein are intended to merely facilitate an understanding of ways in which the exemplary methods of the disclosure may be practiced and to further enable those of skill in the art to practice the exemplary methods of the disclosure. Accordingly, the examples should not be construed as limiting the scope of the exemplary methods of the disclosure.

As stated above, there remains a need to efficiently form, before the onset of back-end-of-line (BEOL) processes in the making of a mixed-signal integrated circuit (IC), a dielectric region in a bulk silicon (Si) substrate of a mixed-signal IC, to improve the quality factor, Q, of an overlying passive resonator.

As the depth of a dielectric region, formed in the bulk Si substrate underlying a passive resonator, may range to about 10 μm, it may be more efficient to deep etch the silicon by a reactive ion etching process, which provides the vertical trench walls of an anisotropic etch profile, and to follow the deep etch with a wet etch to form a larger cavity.

Figure 2A:
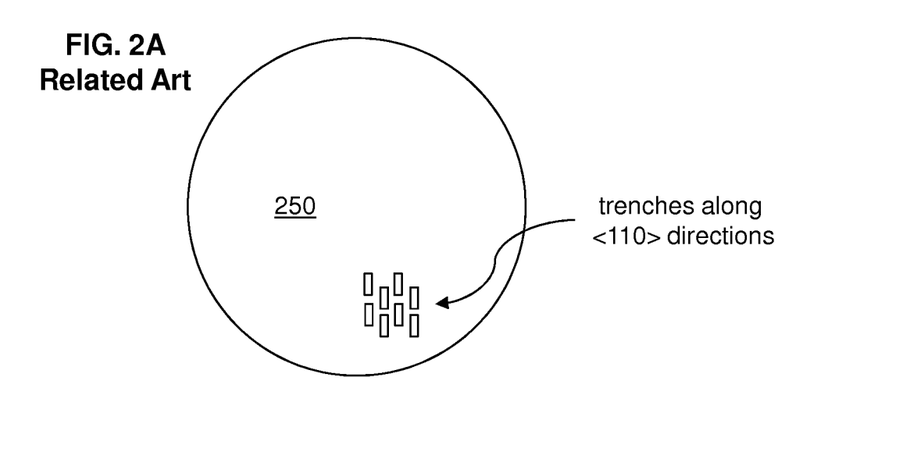
FIG. 2A is a schematic diagram illustrating trenches oriented along <110> directions of a hard mask overlying a (100) silicon (Si) wafer in the prior art.
Figure 2B:
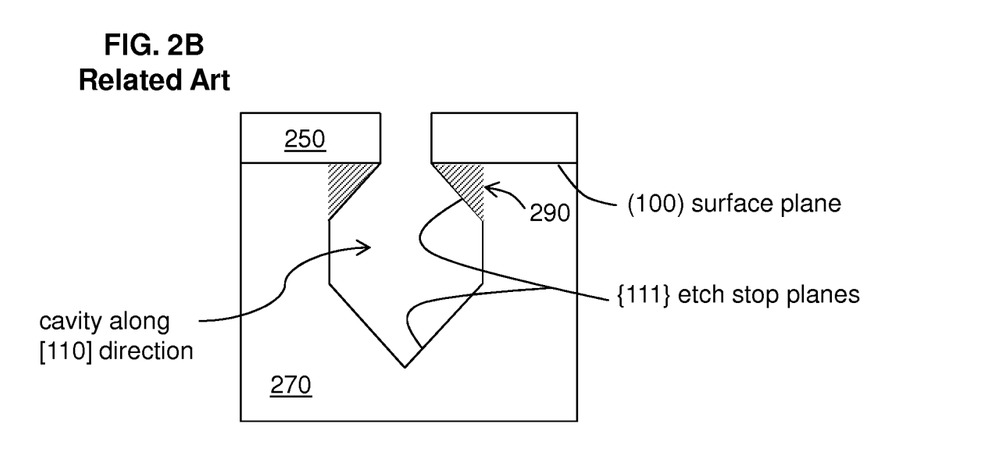
FIG. 2B is a schematic diagram illustrating anisotropic etching through the trenches oriented along <110> directions of a hard mask overlying a (100) silicon (Si) wafer in the prior art.

Referring to FIG. 2A, when rectangular holes oriented along <110> directions of an underlying (100) crystalline silicon (Si) wafer (270) are disposed in a patterned hard mask 250, a deep etch process, such as, reactive ion etching, may form deep trenches oriented along the <110> directions with vertical sidewalls in the crystalline Si wafer 270. As shown in FIG. 2B, a subsequent anisotropic wet etch, introduced into each deep trench, may expand each deep trench laterally until inhibited by {111} etch stop planes of the Si wafer 270. However, as also shown in FIG. 2B, the {111} etch stop planes inhibit the removal of Si directly beneath the hard mask 250, i.e., the undercut (cross-hatched) regions 290.

To enhance Q of the passive resonator, a dielectric region formed in a cavity beneath the passive resonator should provide a comparatively uniform electrical resistance to the underlying bulk Si substrate across the lateral extent of the passive resonator. Thus, it is desirable to use a subsequent wet etch that can remove Si in the undercut (cross-hatched) regions 290 directly beneath the hard mask 250, to create a cavity with vertical sidewalls and a uniform depth across the lateral extent of the passive resonator.

Figure 3A:
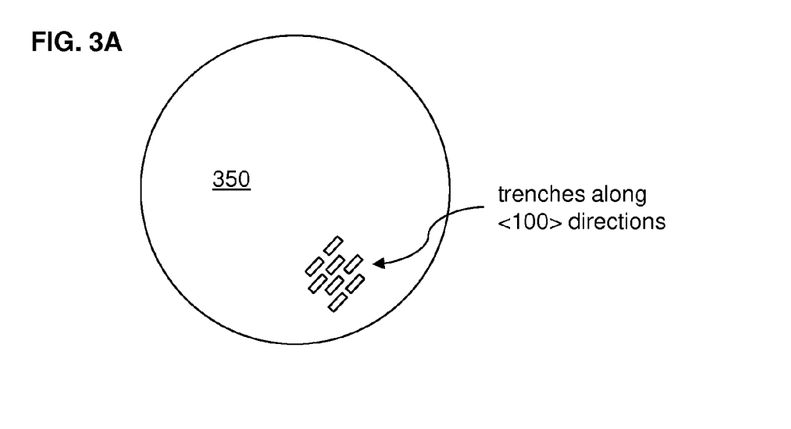
FIG. 3A is a schematic diagram illustrating trenches oriented along <100> directions of a hard mask overlying a (100) silicon (Si) wafer in the prior art.
Figure 3B:
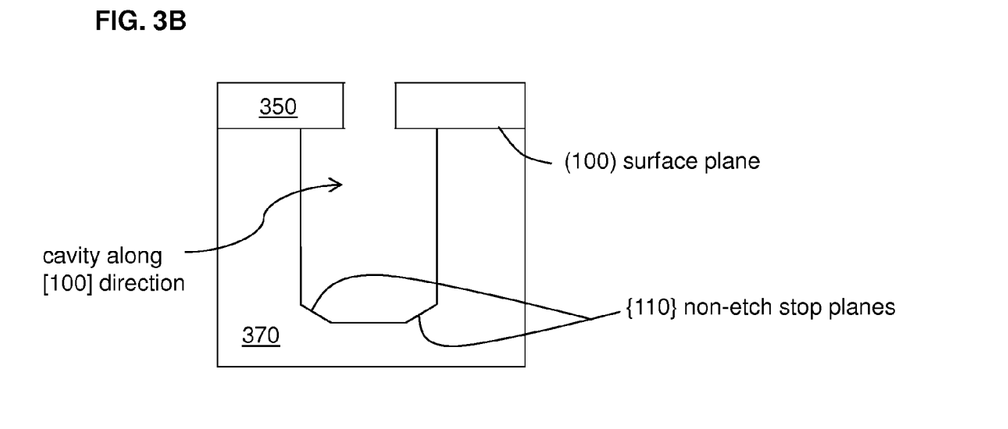
FIG. 3B is a schematic diagram illustrating anisotropic etching through the trenches oriented along <100> directions of a hard mask overlying a (100) silicon (Si) wafer in the prior art.

Referring to FIG. 3A, when rectangular holes oriented along <100> directions of an underlying (100) crystalline silicon (Si) wafer (370) are disposed in a patterned hard mask 350, a deep etch process, such as, reactive ion etching, may form deep trenches oriented along the <100> directions with vertical sidewalls in the crystalline Si wafer 370. Square holes, which are but one geometry of rectangular holes, may also form deep holes oriented along the <100> directions with vertical sidewalls in the crystalline wafer 370. However, in contrast to the anisotropic wet etch of FIG. 2B through the rectangular holes oriented in <110> directions to the crystalline Si wafer 270, a subsequent anisotropic wet etch, introduced into each deep trench oriented along the <100> directions of the crystalline Si wafer 370, is not inhibited by the {110} non-etch stop planes of the Si wafer 370. Thus, deep trenches oriented in <100> directions to the (100) crystalline Si wafer 370 allow removal of the silicon in the undercut regions of FIG. 3B, to provide a cavity with vertical sidewalls and a more uniform depth.

A method of making a dielectric region in a bulk Si substrate of a mixed-signal IC, to provide a high-Q passive resonator, may be shown in FIGS. 4-11.

Figure 4:
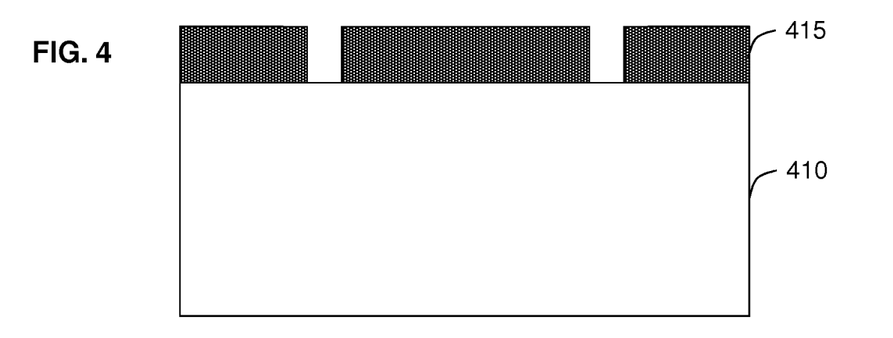
FIG. 4 is a schematic diagram illustrating a structure including a bulk Si substrate and a hard mask used in a method of making a dielectric region in a bulk Si substrate of a mixed-signal IC to provide a high-Q passive resonator.

Referring to FIG. 4, a bulk Si substrate 410 of a (100) crystalline Si wafer may be disposed in an area where a high-Q passive resonator, e.g., one of an inductor and a capacitor, is to be formed in a mixed-signal IC. Front-end-of-line (FEOL) layers may be formed adjacent to the area where the high-Q passive resonator is to be formed, both before and after the making of the dielectric region in the bulk Si substrate 410. A hard mask 415, comprising any of silicon oxide and a silicon nitride may be disposed on the bulk Si substrate 410 in the area where the high-Q passive resonator is to be formed. A plurality of holes may be patterned and etched in the hard mask 415 along the <100> directions of the underlying bulk Si substrate 410 of the (100) crystalline Si wafer by photolithographic processes that are known in the art. The plurality of holes may include square holes, rectangular holes, and combinations of square holes and rectangular holes.

Figure 5:
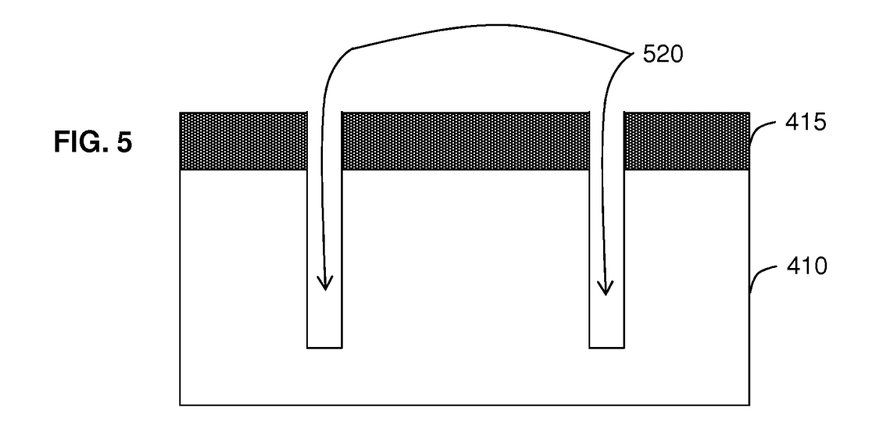
FIG. 5 is a schematic diagram illustrating a structure including deep trenches used in the method of making a dielectric region in a bulk Si substrate of a mixed-signal IC to provide a high-Q passive resonator.

Referring to FIG. 5, deep trench etching may occur through the plurality of holes in the hard mask 415 to form a plurality of deep trenches 520 with vertical sidewalls that extend into the bulk Si substrate 410. The deep trench etching may comprise a reactive ion etching process, which provides the vertical trench walls of an anisotropic etch profile. The plurality of deep trenches may be oriented in the <100> directions of the bulk Si substrate 410 of the (100) crystalline Si wafer.

Figure 6:
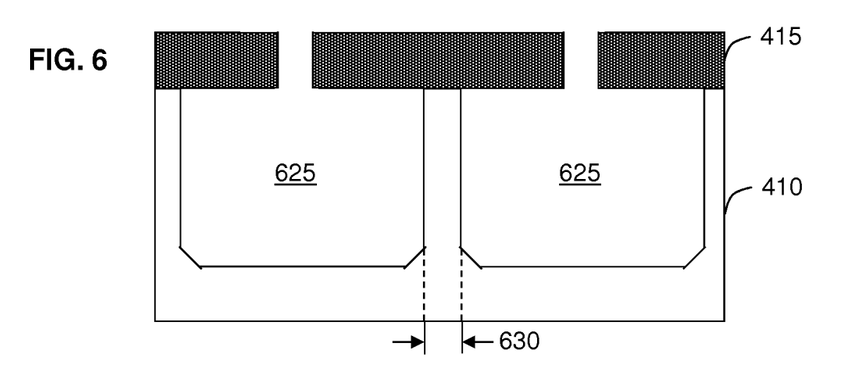
FIG. 6 is a schematic diagram illustrating a structure including a plurality of cavities used in the method of making a dielectric region in a bulk Si substrate of a mixed-signal IC to provide a high-Q passive resonator.

Referring to FIG. 6, wet etching of the plurality of deep trenches 520, which are oriented in the <100> directions of the bulk Si substrate 410 of the (100) crystalline Si wafer, may provide a plurality of cavities 625 that are characterized by thin Si sidewalls 630 between adjacent cavities and may also provide the removal of any Si undercut regions beneath the overlying hard mask 415. The wet etching may be accomplished by anisotropic etchants, including any of ethylenediamine pyrocatechol (EDP), potassium hydroxide/isopropyl alcohol (KOH/IPA), tetramethylammonium hydroxide (TMAH), and ammonia hydroxide because the wet etching along the <100> directions of the plurality of deep trenches 520 is not laterally inhibited by the {110} non-etch stop planes of the bulk Si substrate 405 of the (100) crystalline Si wafer in the making of the plurality of cavities 625.

Figure 7:
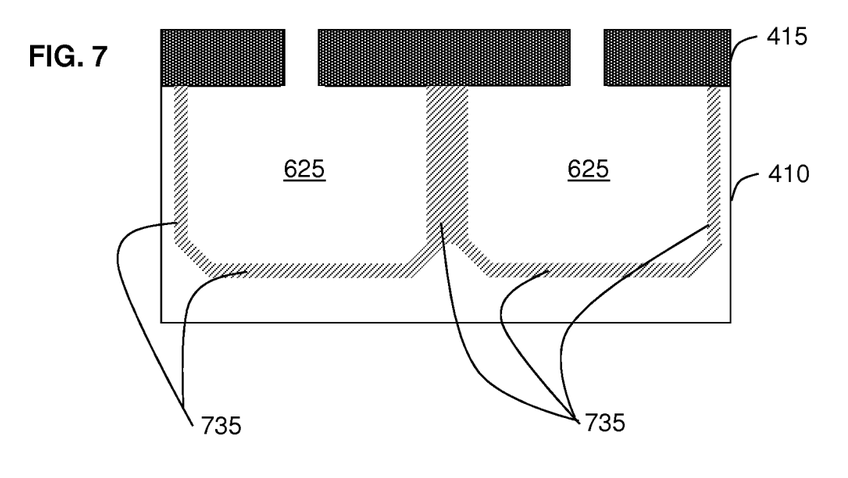
FIG. 7 is a schematic diagram illustrating a structure including oxidized sidewalls of the plurality of cavities used in the method of making a dielectric region in a bulk Si substrate of a mixed-signal IC to provide a high-Q passive resonator.

Referring to FIG. 7, low temperature oxidation may be used to convert the Si sidewalls, including the thin Si sidewalls 630 between adjacent cavities of the plurality of cavities 625, exterior Si sidewalls of the plurality of cavities 625 and bottom walls of the plurality of cavities 625, to silicon oxide sidewalls 735 by, for example, high-pressure wet-oxidation (HiPOX) at a low temperature ranging from 500° to 800° C.

Figure 8:
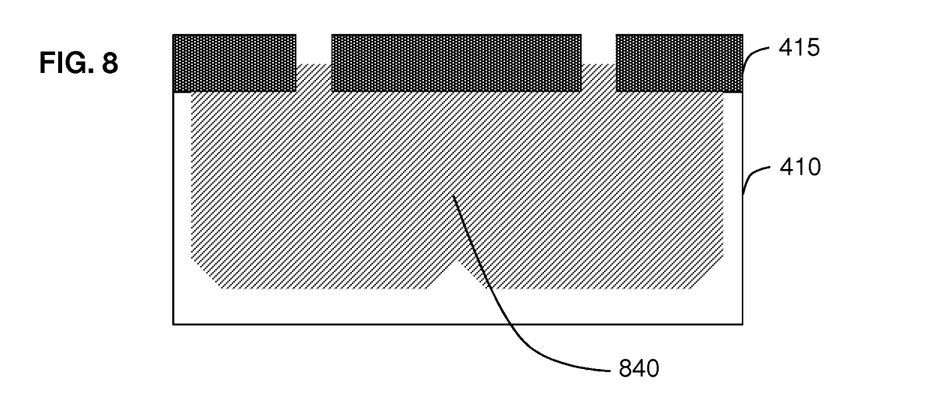
FIG. 8 is a schematic diagram illustrating a structure including a dielectric region, formed by filling the plurality of cavities, used in the method of making a dielectric region in a bulk Si substrate of a mixed-signal IC to provide a high-Q passive resonator.

Referring to FIG. 8, following oxidation of the plurality of cavities 625 to form Si oxide sidewalls 735, the plurality of cavities 625 may be filled with a Si oxide by processes known in the art, to form a dielectric region 840 encompassing the plurality of contiguous cavities 625 and their separating silicon oxide sidewalls 735.

Figure 9:
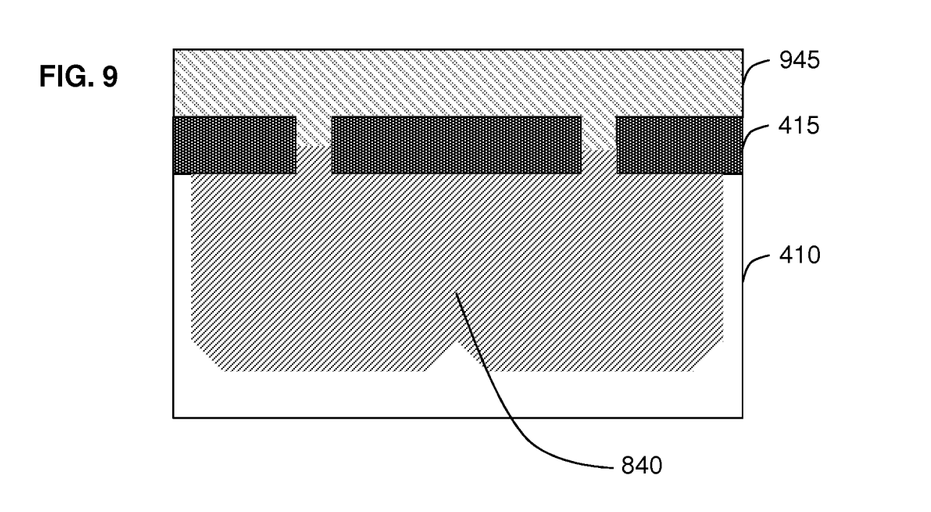
FIG. 9 is a schematic diagram illustrating a structure including a dielectric layer, formed over the dielectric region, used in the method of making a dielectric region in a bulk Si substrate of a mixed-signal IC to provide a high-Q passive resonator.

Referring to FIG. 9, a dielectric layer 945, comprising one of a silicon oxide and a silicon nitride, may be deposited over the hard mask 415 and the dielectric region 840. The dielectric layer 945 may act to seal the underlying plurality of cavities 645 that are now filled with the Si oxide. After deposition, the dielectric layer 945 may be planarized.

Figure 10:
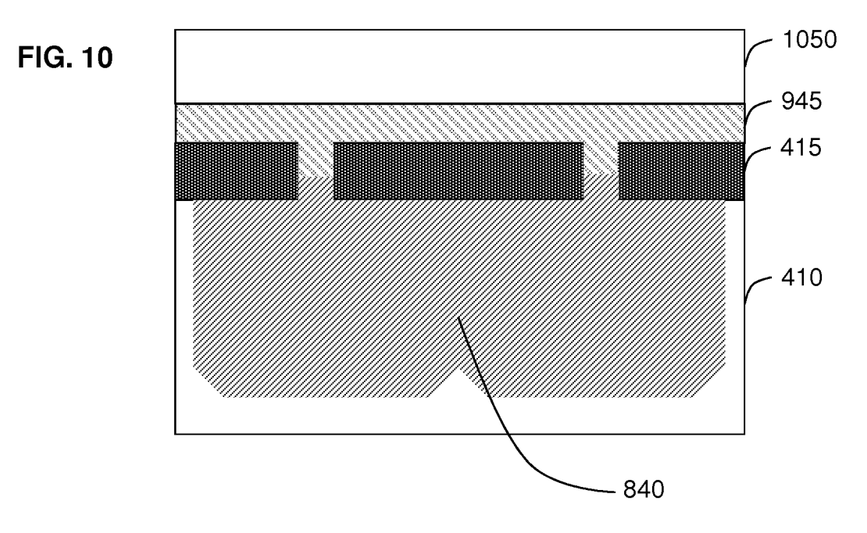
FIG. 10 is a schematic diagram illustrating a structure including a topmost FEOL layer, formed over the dielectric region, used in the method of making a dielectric region in a bulk Si substrate of a mixed-signal IC to provide a high-Q passive resonator.

Referring to FIG. 10, FEOL layers, including a topmost FEOL layer 1050, may be formed over the dielectric layer 945, to conclude the front-end-of-line processes for the making of the mixed-signal IC. The topmost FEOL layer may comprise a passivation layer.

Figure 11:
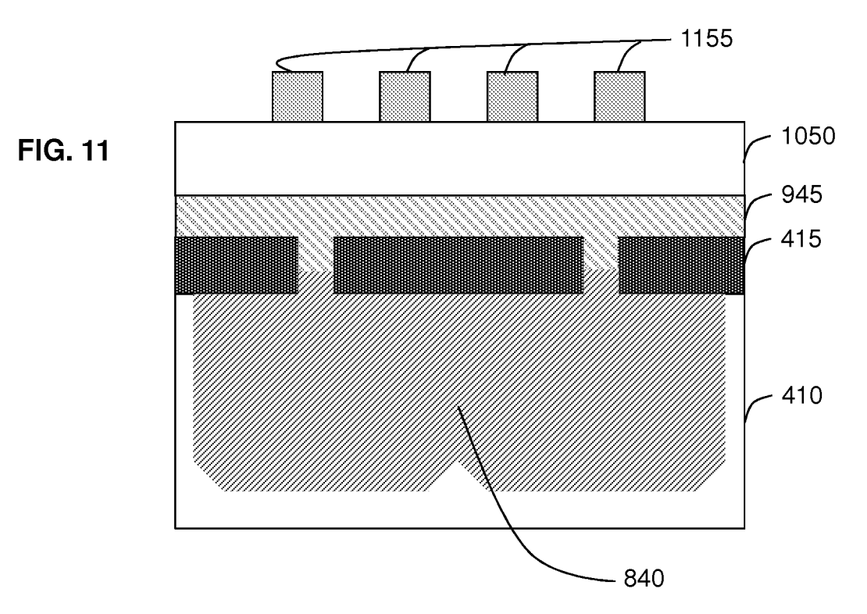
FIG. 11 is a schematic diagram illustrating a structure including a passive resonator, formed over the dielectric region, used in the method of making a dielectric region in a bulk Si substrate of a mixed-signal IC to provide a high-Q passive resonator.

Finally, referring to FIG. 11, a high-Q passive resonator 1155, comprising one of an inductor and a capacitor (not shown), may be formed in the metallization layers, associated with the back-end-of-line (BEOL) processes as is known in the art, over the dielectric region 840 of the mixed-signal IC.

Figure 12:
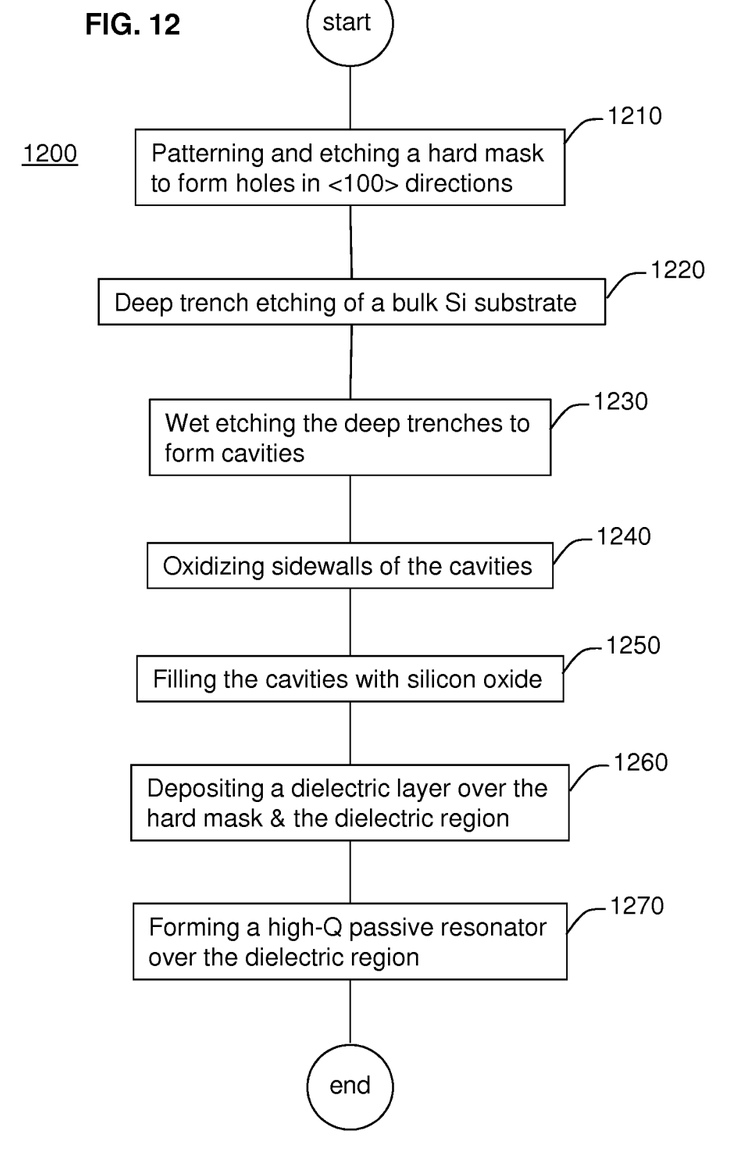
FIG. 12 illustrates a flowchart 1200 for a method of making a dielectric region in a bulk Si substrate of a mixed-signal IC to provide a high-Q passive resonator.

As shown in the flowchart 1200 of FIG. 12, a method of making a dielectric region to provide a high-Q passive resonator in a mixed-signal IC, based on the disclosure above may include: patterning and etching a hard mask to form a plurality of holes along <100> directions that overlie a bulk Si substrate of a (100) Si wafer 1210; deep trench etching the bulk Si substrate through the plurality of holes, to form a plurality of deep trenches with vertical sidewalls 1220; wet etching of the plurality of deep trenches, to provide a plurality of cavities with thin Si sidewalls between adjacent cavities and to remove undercut regions 1230; oxidizing of sidewalls of the plurality of cavities, including the thin Si sidewalls, to form Si oxide sidewalls 1240; filling the plurality of cavities with a Si oxide to form the dielectric region including a plurality of Si oxide filled cavities separated by the thin Si oxide sidewalls 1250; depositing and planarizing a dielectric layer over the hard mask and the dielectric region 1260; and forming the high-Q passive resonator in the metallization layers, associated with back-end-of-line (BEOL) processes, over the dielectric region 1270.

Figure 13:
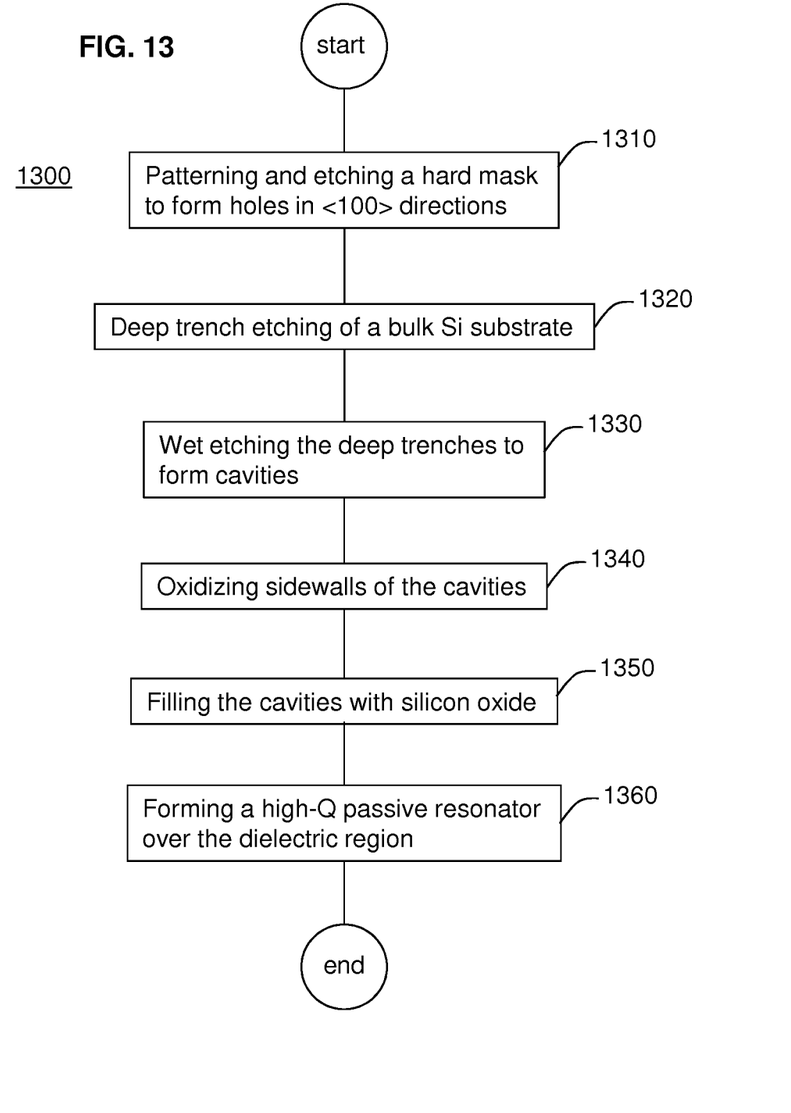
FIG. 13 illustrates a flowchart 1300 for another method of making a dielectric region in a bulk Si substrate of a mixed-signal IC to provide a high-Q passive resonator.

Alternatively, as shown in the flowchart 1300 of FIG. 13, a method of making a dielectric region to provide a high-Q passive resonator in a mixed-signal IC, based on the disclosure above may include: patterning and etching a hard mask to form a plurality of holes along <100> directions that overlie a bulk Si substrate of a (100) Si wafer 1310; deep trench etching the bulk Si substrate through the plurality of holes, to form a plurality of deep trenches 1320; wet etching of the plurality of deep trenches, to provide a plurality of cavities 1330; oxidizing sidewalls of the plurality of cavities to form Si oxide sidewalls 1340; filling the plurality of cavities with a Si oxide to form the dielectric region 1350; and forming the high-Q passive resonator in the metallization layers, associated with back-end-of-line (BEOL) processes, over the dielectric region 1360.

Referring to FIG. 11, the structure of the mixed-signal IC with a dielectric region 840 to provide a high-Q passive resonator 1155 may include: a bulk silicon (Si) substrate 410 of a (100) Si wafer; a dielectric region 840 extending down into the bulk Si substrate 410, and having vertical sidewalls that are oriented in <100> directions; a hard mask 415 including a plurality of holes oriented in said <100> directions that overlies the dielectric region 840 and the bulk Si substrate 410; a dielectric layer 945 that overlies the hard mask 415 and the dielectric region 840; and a high-Q passive resonator 1155, formed in a back-end-of-line (BEOL) metallization layer that overlies the dielectric region 840. Alternatively, a topmost FEOL layer 1050, associated with the FEOL processes in adjacent areas of the mixed-signal IC, may overlie the dielectric layer 945, beneath the high-Q passive resonator 1155 formed in the metallization layers associated with the BEOL processes of making the mixed-signal IC.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a dielectric region to provide a high-Q passive resonator in a mixed-signal integrated circuit (IC), said method comprising:
    patterning and etching a hard mask to form a plurality of holes along <100> directions that overlie a bulk Si substrate of a (100) Si wafer;
    etching said bulk Si substrate through said plurality of holes, said etching forming a plurality of trenches with vertical sidewalls;
    wet etching said plurality of trenches, said wet etching providing a plurality of cavities with thin Si sidewalls between adjacent cavities and said wet etching removing undercut regions in said cavities;
    oxidizing the sidewalls of said plurality of cavities, including said thin Si sidewalls, said oxidizing forming Si oxide sidewalls in said cavities;
    filling said plurality of cavities with a Si oxide forming said dielectric region including a plurality of Si oxide filled cavities separated by said Si oxide sidewalls;
    depositing and planarizing a dielectric layer over said hard mask and said dielectric region; and
    forming said high-Q passive resonator in metallization layers associated with back-end-of-line (BEOL) processes in making of said mixed-signal IC, said metallization layers being over said dielectric region.

2. The method of claim 1, further comprising depositing a topmost front-end-of-line (FEOL) layer, associated with FEOL processes in said making of said mixed-signal IC, on said dielectric layer before said forming of said high-Q passive resonator.

3. The method of claim 1, said hard mask comprising one of a silicon oxide and a silicon nitride.

4. The method of claim 1, said plurality of holes including any of square holes, rectangular holes, and a combination of square holes and rectangular holes.

5. The method of claim 1, said etching comprising a reactive ion etching process, which provides said vertical sidewalls of an anisotropic etch profile.

6. The method of claim 1, said wet etching being accomplished by anisotropic wet etchants, including any of ethylenediamine pyrocatechol (EDP), potassium hydroxide/isopropyl alcohol (KOH/IPA), and tetramethylammonium hydroxide (TMAH), ammonia hydroxide, and ammonia hydroxide.

7. The method of claim 1, said oxidizing said sidewalls comprising using high pressure wet oxidation (HiPOX) at a low temperature ranging from 500° to 800° C.

8. The method of claim 1, said dielectric layer comprising one of a silicon oxide and a silicon nitride.

9. The method of claim 1, said high-Q passive resonator comprising one of an inductor and a capacitor.

10. A method of making a dielectric region to provide a high-Q passive resonator in a mixed-signal integrated circuit (IC), said method comprising:
    patterning and etching a hard mask to form a plurality of holes along <100> directions that overlie a bulk Si substrate of a (100) Si wafer;
    etching said bulk Si substrate through said plurality of holes, to form a plurality of trenches;

wet etching said plurality of trenches, to provide a plurality of cavities;

oxidizing sidewalls of said plurality of cavities to form Si oxide sidewalls;

filling said plurality of cavities with a Si oxide to form said dielectric region; and forming said high-Q passive resonator in metallization layers associated with back-end-of-line (BEOL) processes in making of said mixed-signal IC, said metallization layers being over said dielectric region.

11. The method of claim 10, further comprising depositing a topmost front-end-of-line (FEOL) layer, associated with FEOL processes in said making of said mixed-signal IC, before said forming of said high-Q passive resonator.

12. The method of claim 10, said etching comprising a reactive ion etching process, which provides vertical sidewalls of an anisotropic etch profile for said plurality of trenches.

13. The method of claim 10, said wet etching being accomplished by anisotropic wet etchants, including any of ethylenediamine pyrocatechol (EDP), potassium hydroxide/isopropyl alcohol (KOH/IPA), and tetramethylammonium hydroxide (TMAH), ammonia hydroxide, and ammonia hydroxide.

14. The method of claim 10, said oxidizing said sidewalls comprising using high pressure wet oxidation (HiPOX) at a low temperature.

15. A method comprising:
patterning a hardmask on a surface (100) of a bulk Si substrate of a Si wafer;

forming holes along <100> directions of said bulk Si substrate according to said hardmask;

forming trenches through said holes in said bulk Si substrate, said trenches comprising vertical sidewalls;

forming cavities in said trenches by wet etching said vertical sidewalls;

forming Si oxide sidewalls in said cavities by oxidizing remaining portions of said vertical sidewalls;

forming a dielectric region by filling said cavities with a Si oxide; and forming a high-Q passive resonator over said dielectric region.

16. The method of claim 15, further comprising:
depositing a topmost front-end-of-line (FEOL) layer, associated with FEOL processes in making a mixed-signal IC, before said forming said high-Q passive resonator.

17. The method of claim 15, further comprising:
depositing a dielectric layer over said hard mask and said dielectric region; and planarizing said dielectric layer.

18. The method of claim 15, said forming said trenches through said holes in said bulk Si substrate comprising using a reactive ion etching process, said reactive ion etching process providing an anisotropic etch profile for said trenches.

19. The method of claim 15, said wet etching being accomplished by anisotropic wet etchants, including any of ethylenediamine pyrocatechol (EDP), potassium hydroxide/isopropyl alcohol (KOH/IPA), and tetramethylammonium hydroxide (TMAH), ammonia hydroxide, and ammonia hydroxide.

20. The method of claim 15, said forming said Si oxide sidewalls in said cavities comprising using high pressure wet oxidation (HiPOX) at a low temperature ranging from 500° to 800° C.

\* \* \* \* \*